United States Patent
Yu et al.

(10) Patent No.: US 7,112,847 B1
(45) Date of Patent: Sep. 26, 2006

(54) SMOOTH FIN TOPOLOGY IN A FINFET DEVICE

(75) Inventors: Bin Yu, Cupertino, CA (US); Haihong Wang, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/653,227

(22) Filed: Sep. 3, 2003

(51) Int. Cl.
*H01L 27/01* (2006.01)
(52) U.S. Cl. .................... 257/347; 257/900
(58) Field of Classification Search .......... 257/347, 257/900, 412; 438/151
See application file for complete search history.

(56) References Cited

U.S. PATENT DOCUMENTS

| | | | |
|---|---|---|---|
| 4,807,013 A * | 2/1989 | Manocha | 257/755 |
| 5,663,586 A * | 9/1997 | Lin | 257/336 |
| 6,657,252 B1 * | 12/2003 | Fried et al. | 257/316 |
| 6,787,476 B1 * | 9/2004 | Dakshina-Murthy et al. | 438/740 |
| 6,800,885 B1 * | 10/2004 | An et al. | 257/275 |
| 6,853,020 B1 * | 2/2005 | Yu et al. | 257/270 |
| 2003/0151077 A1 * | 8/2003 | Mathew et al. | 257/250 |

OTHER PUBLICATIONS

Digh Hisamoto et al.: "FinFE—A Self-Aligned Double-Gate MOSFET Scalable to 20 nm," IEEE Transactions on Electron Devices, vol. 47, No. 12, Dec. 2000, pp. 2320-2325.
Yang-Kyu Choi et al.: "Sub-20nm CMOS Fin FET Technologies," 2001 IEEE, IEDM, pp. 421-424.
Xuejue Huang et al.: "Sub-50 nm P-Channel Fin FET," IEEE Transactions on Electron Devices, vol. 48, No. 5, May 2001, pp. 880-886.
Yang-Kyu Choi et al.: "Nanoscale CMOS Spacer FinFET for the Terabit Era," IEEE Electron Device Letters, vol. 23, No. 1, Jan. 2002, pp. 25-27.
Xuejue Huang et al.: "Sub 50-nm FinFET: PMOS," 1999 IEEE, IEDM, pp. 67-70, Dec. 1999.

* cited by examiner

*Primary Examiner*—Mark V. Prenty
(74) *Attorney, Agent, or Firm*—Harrity Snyder LLP (57) ABSTRACT

A semiconductor device includes a semiconductor fin formed on an insulator and sidewall spacers formed adjacent the sides of the fin. A gate material layer is formed over the fin and the sidewall spacers and etched to form a gate. The presence of the sidewall spacers causes a topology of the gate material layer to smoothly transition over the fin and the first and second sidewall spacers.

7 Claims, 8 Drawing Sheets

Fig. 8

SMOOTH FIN TOPOLOGY IN A FINFET DEVICE

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In several respects, the double-gate MOSFETs offer better characteristics than the conventional bulk silicon MOSFETs. These improvements arise in part because the double-gate MOSFET has a gate electrode on both sides of the channel, rather than only on one side as in conventional MOSFETs. When there are two gates, the electric field generated by the drain is better screened from the source end of the channel. Also, two gates can control roughly twice as much current as a single gate, resulting in a stronger switching signal.

A FinFET is a recent double-gate structure that exhibits good short channel behavior. A FinFET includes a channel formed in a vertical fin. The FinFET structure may be fabricated using layout and process techniques similar to those used for conventional planar MOSFETs.

SUMMARY OF THE INVENTION

Implementations consistent with the present invention provide a double-gate MOSFET having an improved topology in the gate area. The improved topology can lead to reduced "micromasking" effects that may otherwise be encountered during patterning/etching of the gate.

A first aspect of the invention is directed to a semiconductor device. The semiconductor device includes a semiconductor fin, a source region adjacent a first end of the fin, and a drain region adjacent to a second end of the fin. A first sidewall spacer is formed adjacent a first side of the fin and a second sidewall spacer formed adjacent a second side of the fin. The sidewall spacers have a substantially triangular shape. A gate is formed over the fin, the first sidewall spacer, and the second sidewall spacer in a channel region of the fin.

A second aspect of the invention is directed to a method of manufacturing a semiconductor device. The method includes forming a fin structure on an insulator, forming a first sidewall spacer adjacent a first side of the fin structure, and forming a second sidewall spacer adjacent a second side of the fin structure. The sidewall spacers have a substantially triangular shaped cross-section. The method further includes depositing a gate material layer over the fin structure, the first sidewall spacer, and the second sidewall spacer. The first and second sidewall spacers cause a gradual sloping of the gate material layer over the fin and the first and second sidewall spacers. The method further includes etching the gate material layer to form at least one gate for the semiconductor device.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers may be used in different drawings to identify the same or similar elements. Also, the following detailed description does not limit the invention. Instead, the scope of the invention is defined by the appended claims and equivalents.

Figure 1:
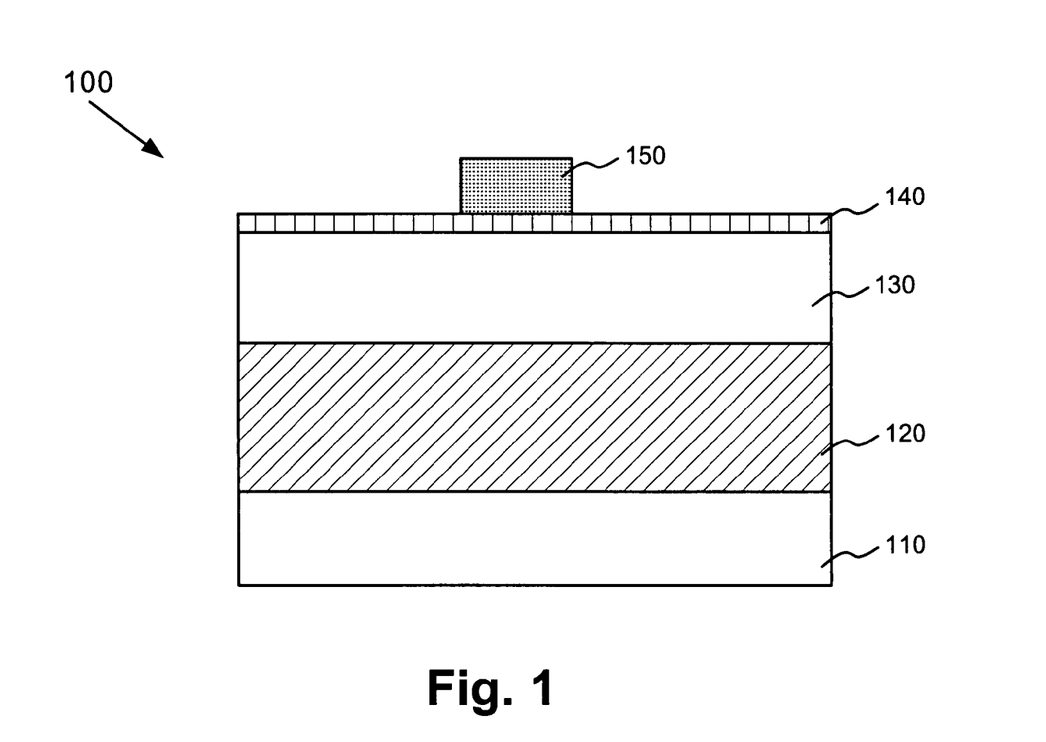
FIG. 1 is a diagram illustrating the cross-section of an exemplary semiconductor device.

A FinFET, as the term is used herein, refers to a type of MOSFET in which a conducting channel is formed in a vertical Si "fin." FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 formed on the buried oxide layer 120. Buried oxide layer 120 and silicon layer 130 may be formed on substrate 110 in a conventional manner.

In an exemplary implementation, buried oxide layer 120 may include a silicon oxide and may have a thickness ranging from about 1000 Å to about 3000 Å. Silicon layer 130 may include monocrystalline or polycrystalline silicon.

Silicon layer 130 is used to form a fin structure for a double-gate transistor device, as described in more detail below.

In alternative implementations consistent with the present invention, substrate 110 and layer 130 may include other semiconducting materials, such as germanium, or combinations of semiconducting materials, such as silicon-germanium. Buried oxide layer 120 may also include other dielectric materials.

A dielectric layer 140, such as a silicon nitride layer or a silicon oxide layer (e.g., $SiO_2$), may be formed over silicon layer 130 to act as a protective cap during subsequent etching processes. In an exemplary implementation, dielectric layer 140 may be grown to a thickness ranging from about 150 Å to about 700 Å. Next, a photoresist material may be deposited and patterned to form a photoresist mask 150 for subsequent processing. The photoresist may be deposited and patterned in any conventional manner.

Semiconductor device 100 may then be etched and the photoresist mask 150 may be removed. In an exemplary implementation, silicon layer 130 may be etched in a conventional manner, with the etching terminating on buried oxide layer 120 to form a fin. After the formation of the fin, source and drain regions may be formed adjacent the respective ends of the fin. For example, in an exemplary embodiment, a layer of silicon, germanium or combination of silicon and germanium may be deposited, patterned and etched in a conventional manner to form source and drain regions. In other implementations, silicon layer 130 may be patterned and etched to form source and drain regions simultaneously with the fin.

Figure 2A:
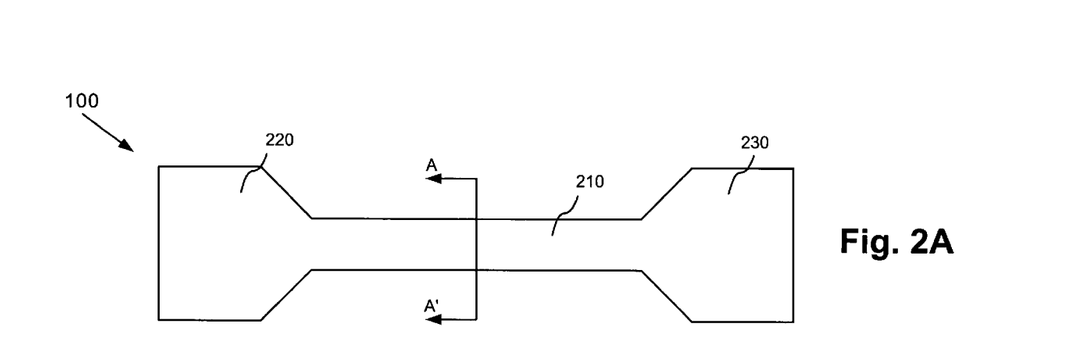
FIG. 2A is a diagram illustrating the top view of a fin structure formed on the semiconductor device shown in FIG. 1 in accordance with an exemplary embodiment.
Figure 2B:
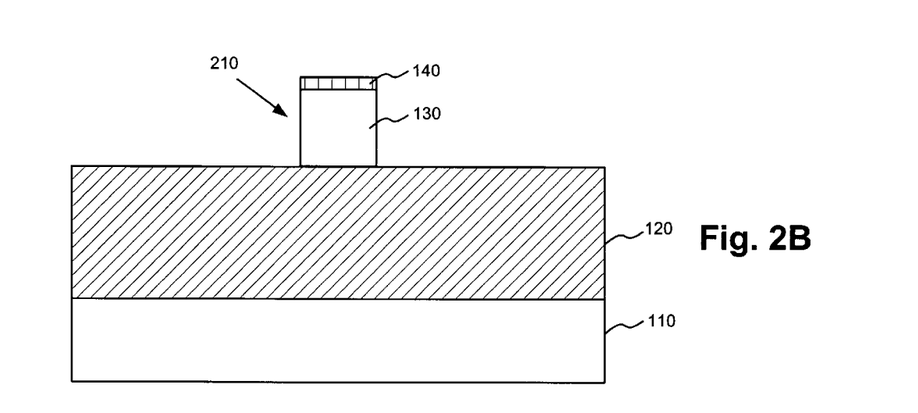
FIG. 2B is a diagram illustrating a cross-section along line A–A' in FIG. 2A.

FIG. 2A schematically illustrates the top view of a fin structure on semiconductor device 100 formed in such a manner. Source region 220 and drain region 230 may be formed adjacent the ends of fin structure 210 on buried oxide layer 120, according to an exemplary embodiment of the present invention FIG. 2B is a cross-section along line A–A' in FIG. 2A illustrating the formation of fin structure 210. As described above, dielectric layer 140 and silicon layer 130 may be etched to form fin structure 210 having a dielectric cap 140.

Figure 3:
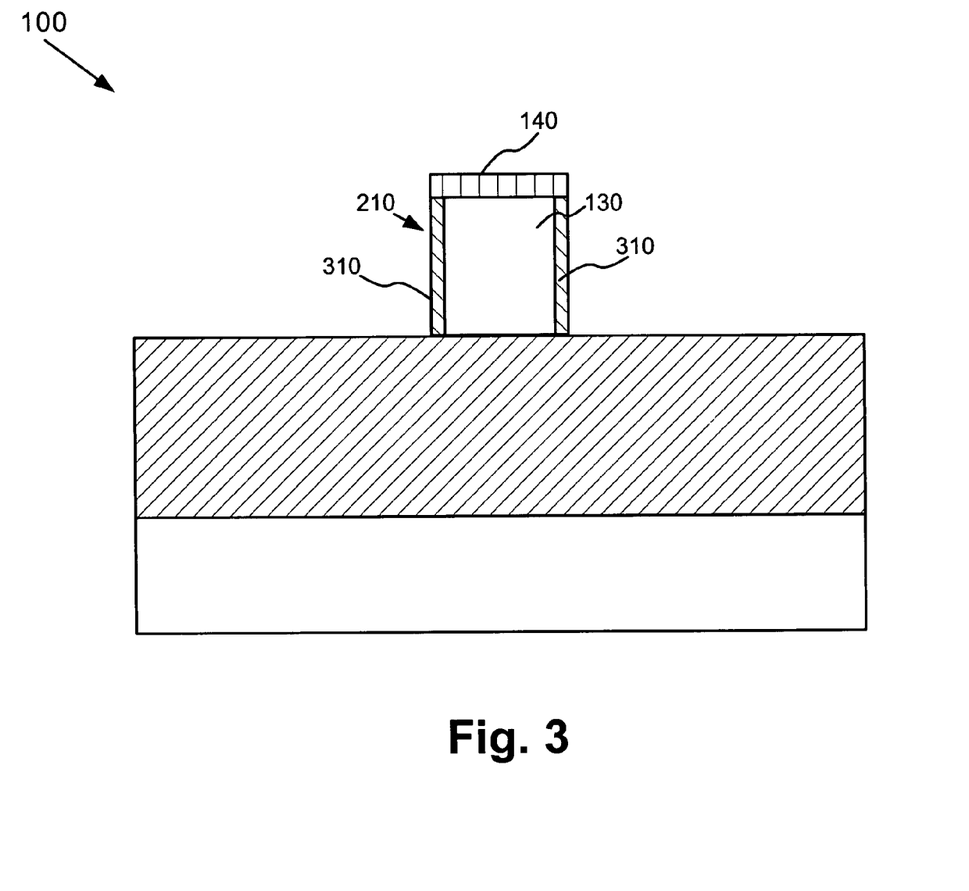
FIG. 3 is a diagram illustrating a cross-section of a gate dielectric layer and gate material over the fin structure shown in FIG. 2B in accordance with an exemplary embodiment.

FIG. 3 is a cross-section illustrating the formation of a gate dielectric layer and gate material over fin structure 210 in accordance with an exemplary embodiment of the present invention. A dielectric layer may be formed on fin structure 210. For example, a thin oxide film 310 may be thermally grown on fin structure 210, as illustrated in FIG. 3. The oxide film 310 may be grown to a thickness of about 50 Å to about 100 Å and may be formed on the exposed side surfaces of fin structure 210.

Figure 4:
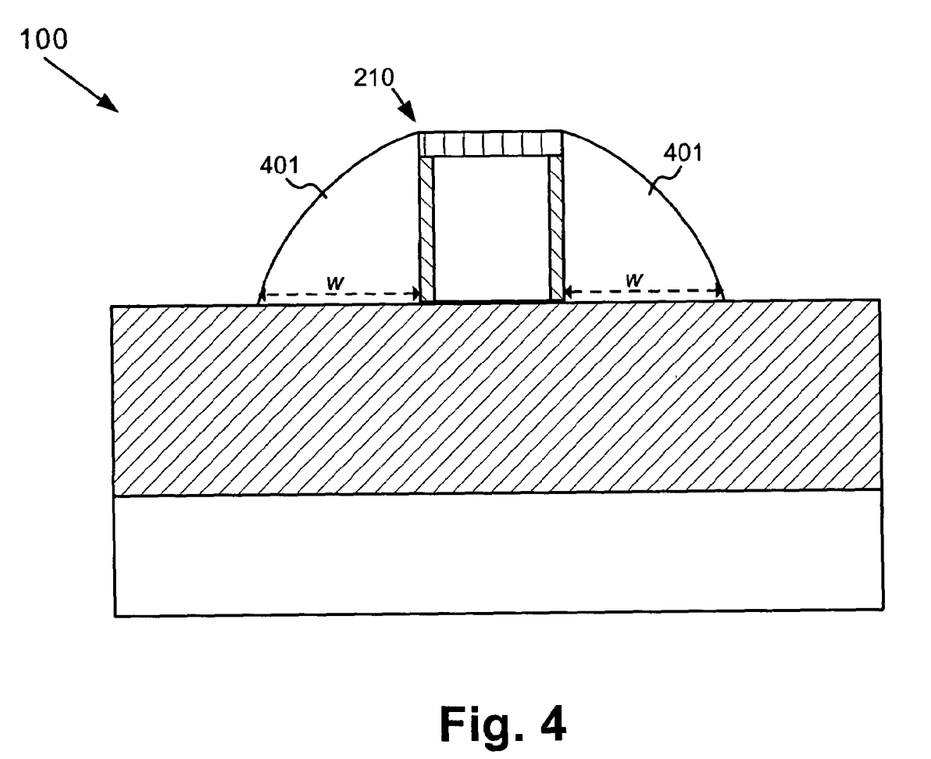
FIG. 4 is a cross-section illustrating spacers formed around the fin structure shown in FIGS. 2B and 3 in accordance with an exemplary embodiment.

A material may be deposited over fin structure 210 and etched to form spacers. The polysilicon layer may then be etched to form spacers 401, as illustrated in FIG. 4. Alternatively, other materials may be used to form spacers 401. As shown, spacers 401 are formed in a roughly triangular shape. Spacers 401 may extend to a width, labeled width w in FIG. 4, ranging from about 150 Å to about 1000 Å and may slope at an angle. The triangular, graded slope of spacers 401 reduce gate patterning problems as described in more detail below.

Figure 5:
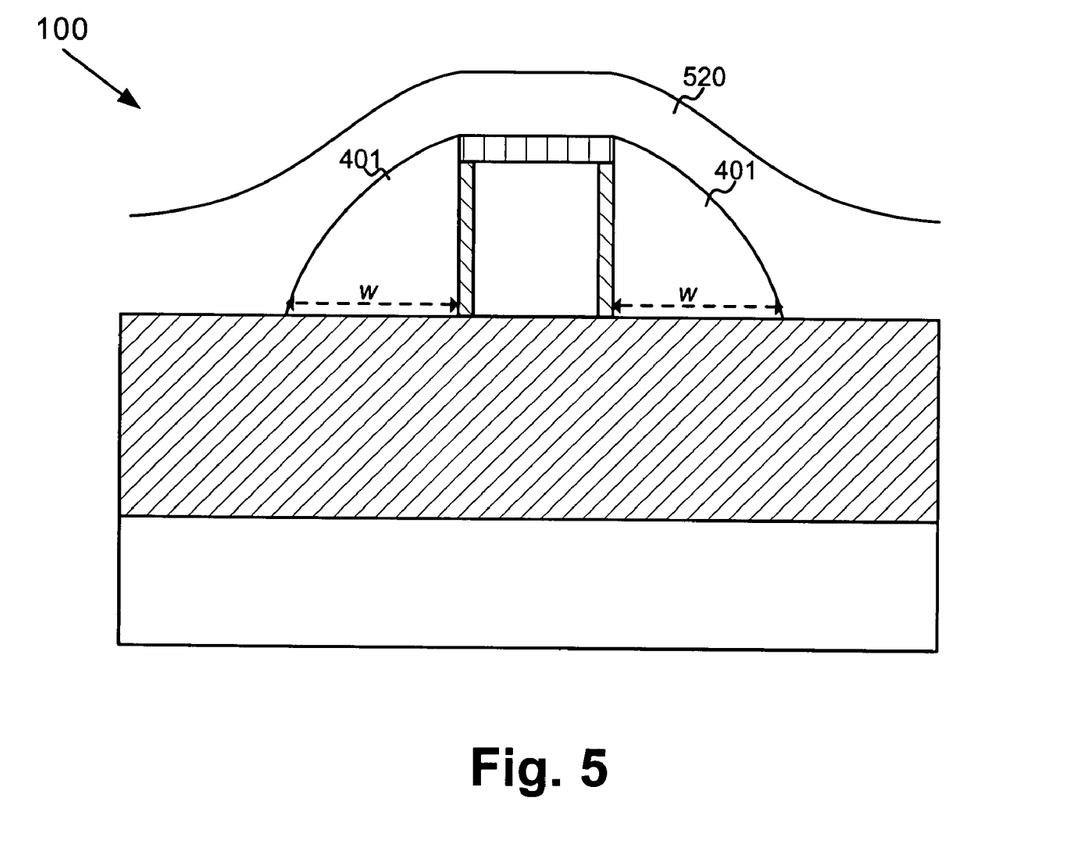
FIG. 5 is a cross-section illustrating a further stage in the formation of semiconductor device shown in FIG. 4 in accordance with an exemplary embodiment.

FIG. 5 is a cross-section illustrating a further stage in the formation of semiconductor device 100. As shown in FIG. 5, a gate material layer 520 may be deposited over semiconductor device 100. In an exemplary implementation, the gate material layer 520 may include polysilicon deposited using conventional chemical vapor deposition (CVD) or other well known techniques. Gate material 520 may be deposited to a thickness ranging from about 500 Å to 2800 Å. Alternatively, other semiconducting materials, such as germanium or combinations of silicon and germanium, or various metals may be used as the gate material. Gate material layers 320 may be patterned and etched to form the conductive gate(s) of FinFET 100.

Figure 6:
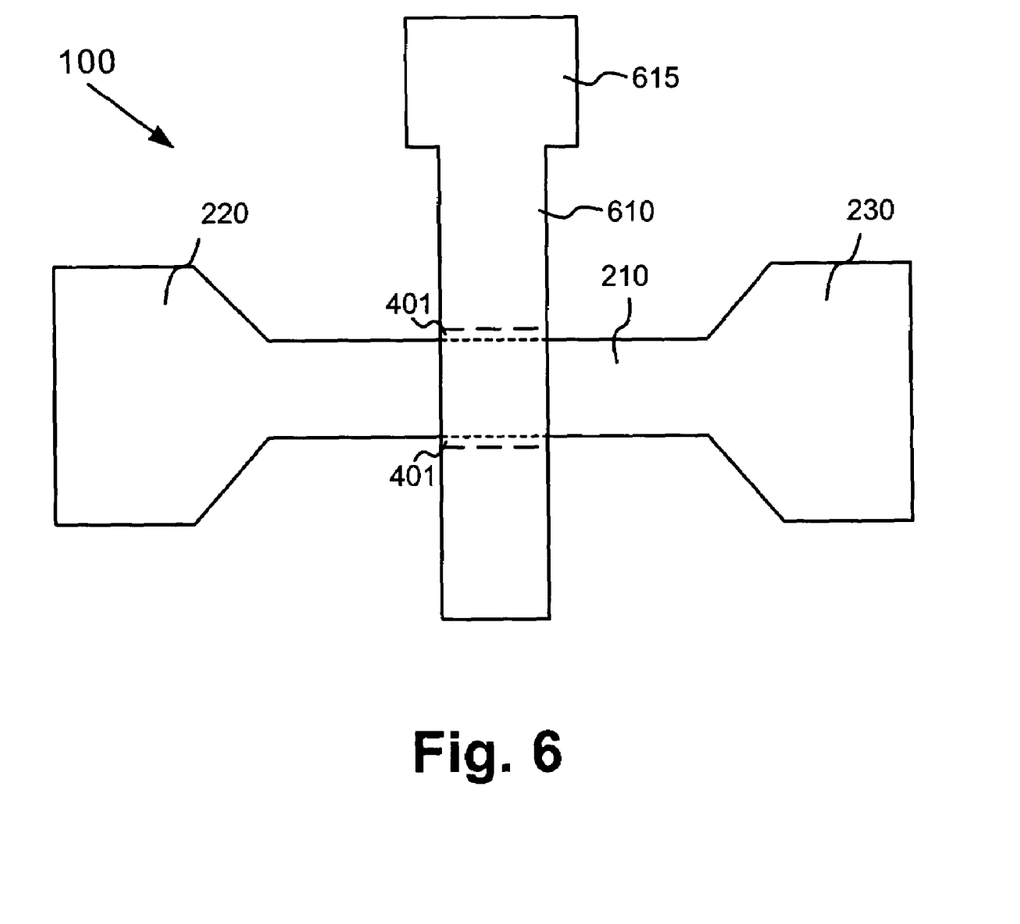
FIG. 6 schematically illustrates a top view of the semiconductor device including a gate structure in accordance with an exemplary embodiment.

FIG. 6 schematically illustrates the top view of semiconductor device 100 illustrating a gate structure 610 patterned and etched from gate material layer 520. Gate structure 610 extends across a channel region of fin structure 210 with spacers 401 adjacent gate 610 and fin structure 210. Gate structure 610 may include a gate portion proximate to the sides of fin structure 210 and a larger electrode portion 615 spaced apart from fin structure 210. Gate electrode portion 615 of gate structure 610 may provide an accessible electrical contact for biasing or otherwise controlling the gate portion.

Consistent with an aspect of the invention, the triangular-shaped spacers 401 (FIG. 4) help to reduce gate patterning and etching challenges caused by topography, such as micomasking effects that would otherwise occur when etching gate material layer 520 to form gate structure 610. Micromasking effects refer to undesired microstructures that can occur in semiconductor processing when etching a surface. If the triangular spacers 401 were not first formed before depositing gate material layer 520, gate material layer 520 would have a topology that includes a steeper gradient than the gradual slope shown for gate material layer 520.

Figure 7:
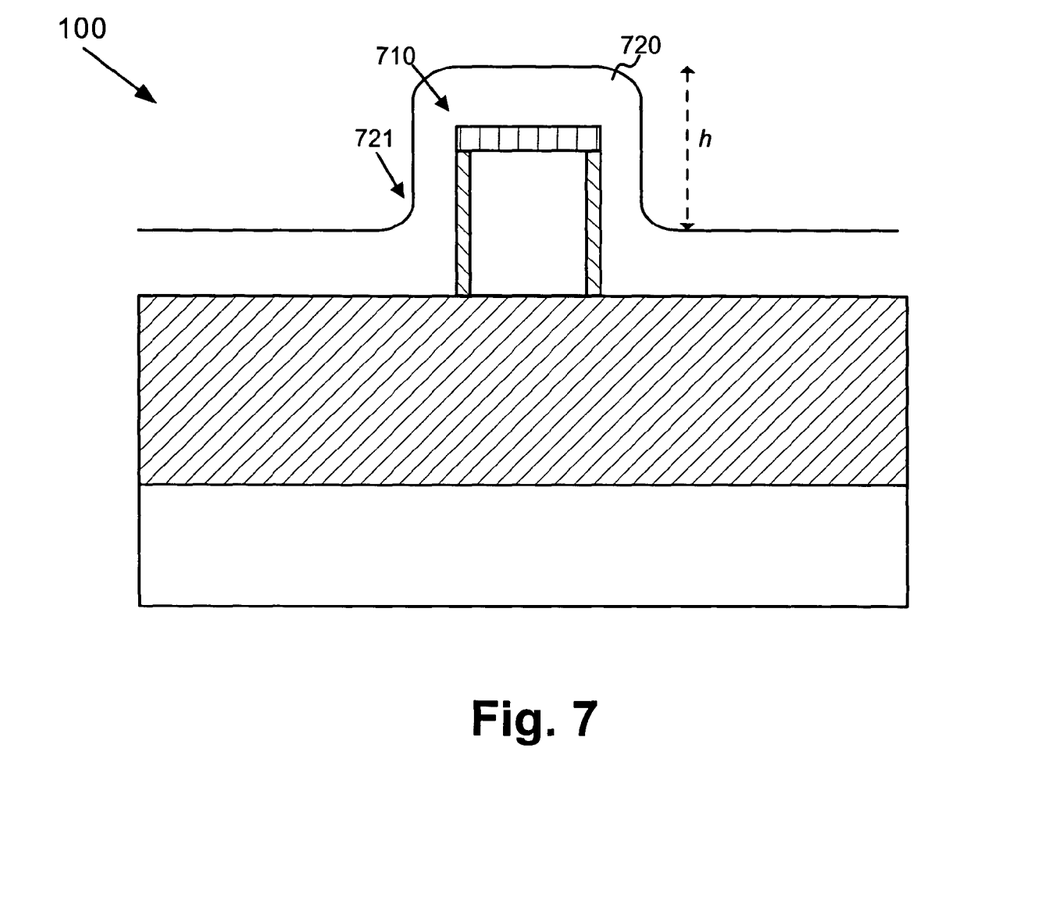
FIG. 7 is a cross-section illustrating a gate material layer formed over a fin structure in which the spacers shown in FIG. 4 are not first formed.

FIG. 7 is a cross-section illustrating a gate material layer 720 formed over a fin structure 710 in which spacers 401 are not first formed. As shown, gate material layer 720 may have a relatively sharp gradient 721 having a height h, which may be about 1000 Å to 1500 Å. Sharp gradient 721 may tend to induce micromasking effects in gate material layer 720 during gate etching. Such micromasking effects can undesirably effect the operation of the semiconductor device. In contrast to gate material layer 720, gate material layer 520, formed consistent with aspects of the invention, has a more gradual slope and tends to be resistant to micromasking effects. For example, gate material layer 520 (FIG. 5) may have a gradual slope, as opposed to the near 90° slope in gate layer 720.

After formation of the gate structure 610, the source/drain regions 220 and 230 may then be doped. For example, n-type or p-type impurities may be implanted in source/drain regions 220 and 230. The particular implantation dosages and energies may be selected based on the particular end device requirements. One of ordinary skill in this art would be able to optimize the source/drain implantation process based on the circuit requirements and such acts are not disclosed herein in order not to unduly obscure the thrust of the present invention. Activation annealing may then be performed to activate the source/drain regions 220 and 230.

OTHER IMPLEMENTATIONS

Figure 8:
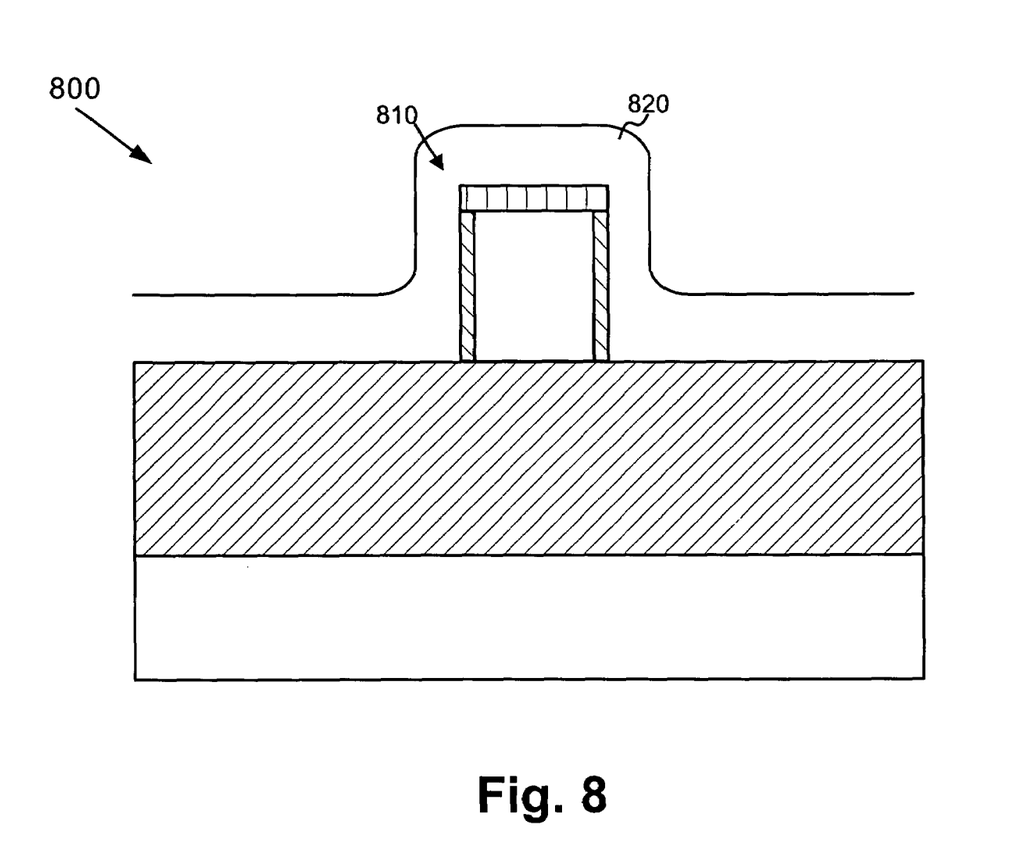
FIG. 8 is a cross-section illustrating a gate material layer formed in manner simialr to the gate material layer shown in FIG. 7.

In some applications, it may be desirable to form a FinFET that can potentially be configured to have multiple threshold voltages. FIG. 8 is a cross-section illustrating a gate material layer 820 formed around a fin 810 of a semiconductor device 800. FIG. 8 is similar to the cross-section shown in FIG. 7. In FIG. 8, however, gate material layer 820 may be formed from tantalum nitride (TaN). A FinFET formed with TaN will have a characteristic threshold voltage. Gate material 820 may next be subjected to a silane soak, which changes the work function of gate material 820 by changing the gate material to TaSiN. The changed gate material layer will thus form a semiconductor device 800 that will have a different threshold voltage than when the semiconductor device is not subjected to the silane soak. In some applications, a protective layer may be formed over certain ones of a number of semiconductor devices 800 on a single semiconductor wafer before performing the silane soak. Accordingly, some of semiconductor devices 800 may be changed to have the TaSiN gate material while others have the TaN gate material. Thus, devices having different work functions and different threshold voltages may both operate on the same wafer.

CONCLUSION

The FinFET described herein includes spacers formed around the fin before forming the gate material. The spacers smooth the topology of the gate material, which reduces the occurrence of undesirable effects during gate patterning and etching.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of chemical vapor deposition (CVD) processes, including low pressure chemical vapor deposition (LPCVD) and enhanced chemical vapor deposition (ECVD) can be employed.

The present invention is applicable in the manufacturing of semiconductor devices and particularly in semiconductor devices with design features of 100 nm and below, resulting in increased transistor and circuit speeds and improved reliability. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A semiconductor device comprising:
   an insulator;
   a semiconductor fin formed on the insulator;
   a source region adjacent a first end of the fin formed on the insulator;
   a drain region adjacent a second end of the fin formed on the insulator;
   a first sidewall spacer formed adjacent a first side of the fin, the first sidewall spacer having a substantially triangular shaped cross-section;
   a second sidewall spacer formed adjacent a second side of the fin, the second sidewall spacer having a substantially triangular shaped cross-section; and
   a gate formed over the fin and the first and second sidewall spacers, and in contact with the first and second sidewall spacers, in a channel region of the semiconductor device,
   wherein the first and second sidewall spacers are formed to a width ranging from about 150 Å to about 1000 Å and wherein the first and second sidewall spacers cause a topology of the gate to smoothly transition over the fin and the first and second sidewall spacers to reduce micromasking effects during etching of the gate.

2. The semiconductor device of claim 1, wherein the first and second sidewall spacers slope away from the fin.

3. The semiconductor device of claim 1, wherein the gate includes an electrode portion formed away from the fin.

4. The semiconductor device of claim 1, wherein the first and second sidewall spacers are formed of polysilicon.

5. The semiconductor device of claim 4, wherein the gate comprises polysilicon.

6. A FinFET device comprising:
   an insulator;
   a semiconductor fin formed on the insulator;
   a source region connected to a first end of the fin and formed on the insulator;
   a drain region connected to a second end of the fin and formed on the insulator;
   a first sidewall spacer formed adjacent a first side of the fin in a roughly triangular shape;
   a second sidewall spacer formed adjacent a second side of the fin in a roughly triangular shape; and
   a gate formed over the fin, the first sidewall spacer, and the second sidewall spacer, and in contact with the first and second sidewall spacers, in a direction perpendicular to a direction of the fin, whereby the first and second sidewall spacers cause a topology of the gate to smoothly transition over the fin and the first and second sidewall spacers and the first and second sidewall spacers reduce micromasking effects during etching of a gate material to form the gate,
   wherein the first and second sidewall spacers are formed to a width of about 150 Å to about 1000 Å.

7. The FinFET device of claim 6, wherein the first and second sidewall spacers slope away from the fin.

* * * * *